United States Patent
Ding et al.

(10) Patent No.: US 9,721,854 B2
(45) Date of Patent: Aug. 1, 2017

(54) STRUCTURE AND METHOD FOR IN-LINE DEFECT NON-CONTACT TESTS

(71) Applicant: INTERNATIONAL BUSINESS MACHINES CORPORATION, Armonk, NY (US)

(72) Inventors: Hanyi Ding, Colchester, VT (US); Kai D. Feng, Hopewell Junction, NY (US); Ping-Chuan Wang, Hopewell Junction, NY (US); Zhijian Yang, Stormville, NY (US)

(73) Assignee: International Business Machines Corporation, Armonk, NY (US)

( * ) Notice: Subject to any disclaimer, the term of this patent is extended or adjusted under 35 U.S.C. 154(b) by 908 days.

(21) Appl. No.: 13/705,213

(22) Filed: Dec. 5, 2012

(65) Prior Publication Data
US 2014/0152337 A1    Jun. 5, 2014

(51) Int. Cl.
| H01L 21/66 | (2006.01) |
| G01R 31/02 | (2006.01) |
| G01R 31/26 | (2014.01) |
| G01R 31/28 | (2006.01) |

(52) U.S. Cl.
CPC ............ *H01L 22/14* (2013.01); *G01R 31/024* (2013.01); *G01R 31/2644* (2013.01); *H01L 22/34* (2013.01); *G01R 31/2884* (2013.01); *H01L 2924/0002* (2013.01)

(58) Field of Classification Search
CPC .. G01R 31/024; G01R 31/025; G01R 31/026; G01R 31/26; G01R 31/2884; G01B 7/22; G01B 7/24
See application file for complete search history.

(56) References Cited

U.S. PATENT DOCUMENTS

| 6,265,890 | B1 | 7/2001 | Chacon et al. |
| 6,734,960 | B1 | 5/2004 | Goto et al. |
| 6,819,120 | B2 | 11/2004 | Tam |
| 6,859,031 | B2 | 2/2005 | Pakdaman et al. |
| 6,909,291 | B1 | 6/2005 | Xu et al. |
| 7,026,175 | B2 | 4/2006 | Li et al. |
| 7,102,363 | B2 | 9/2006 | Talanov et al. |
| 7,187,179 | B1 | 3/2007 | Scaman et al. |
| 7,969,564 | B2 | 6/2011 | Almogy et al. |
| 7,982,457 | B2 | 7/2011 | Redko et al. |
| 2002/0068682 | A1* | 6/2002 | Shen .................... H01P 1/20381 |
| | | | 505/210 |

(Continued)

*Primary Examiner* — Son Le
*Assistant Examiner* — Dustin Dickinson
(74) *Attorney, Agent, or Firm* — L. Jeffrey Kelly

(57) ABSTRACT

A system, method and apparatus may comprise a wafer having a plurality of spiral test structures located on the kerf of the wafer. The spiral test structure may comprise a spiral connected at either end by a capacitor to allow the spiral test structure to resonate. The spiral structures may be located on a first metal layer or on multiple metal layers. The system may further incorporate a test apparatus having a frequency transmitter and a receiver. The test apparatus may be a sensing spiral which may be placed over the spiral test structures. A controller may provide a range of frequencies to the test apparatus and receiving the resonant frequencies from the test apparatus. The resonant frequencies will be seen as reductions in signal response at the test apparatus.

28 Claims, 8 Drawing Sheets

(56) References Cited

U.S. PATENT DOCUMENTS

| | | | |
|---|---|---|---|
| 2002/0121914 A1 | 9/2002 | Chacon et al. | |
| 2004/0007326 A1 | 1/2004 | Roche et al. | |
| 2004/0140861 A1* | 7/2004 | Alvarez | H01P 7/084 333/99 S |
| 2005/0223812 A1* | 10/2005 | Denis | G01M 5/0033 73/799 |
| 2006/0070450 A1* | 4/2006 | Woodard | G01N 3/38 73/767 |
| 2006/0234398 A1 | 10/2006 | Gluschenkov et al. | |
| 2007/0236851 A1* | 10/2007 | Shameli | G06K 19/0723 361/113 |
| 2008/0197285 A1* | 8/2008 | Frey | B82Y 20/00 250/336.2 |
| 2009/0085589 A1* | 4/2009 | Hsieh | G01R 31/2822 324/762.01 |
| 2009/0240452 A1* | 9/2009 | Anemikos | H01L 22/12 702/76 |
| 2010/0045304 A1 | 2/2010 | Nagasaki | |
| 2010/0231253 A1 | 9/2010 | Kitagawa et al. | |
| 2010/0253380 A1* | 10/2010 | Martin | H01L 22/34 324/762.01 |
| 2010/0332011 A1* | 12/2010 | Venugopal | H01J 37/32935 700/109 |
| 2011/0006794 A1 | 1/2011 | Sellathamby et al. | |
| 2011/0010107 A1* | 1/2011 | Fedder | G01N 27/127 702/22 |
| 2011/0050262 A1 | 3/2011 | Chen et al. | |
| 2012/0062334 A1* | 3/2012 | Yehezkely | H01P 5/184 333/119 |
| 2013/0169308 A1* | 7/2013 | Ouyang | H01L 22/34 324/762.03 |

* cited by examiner

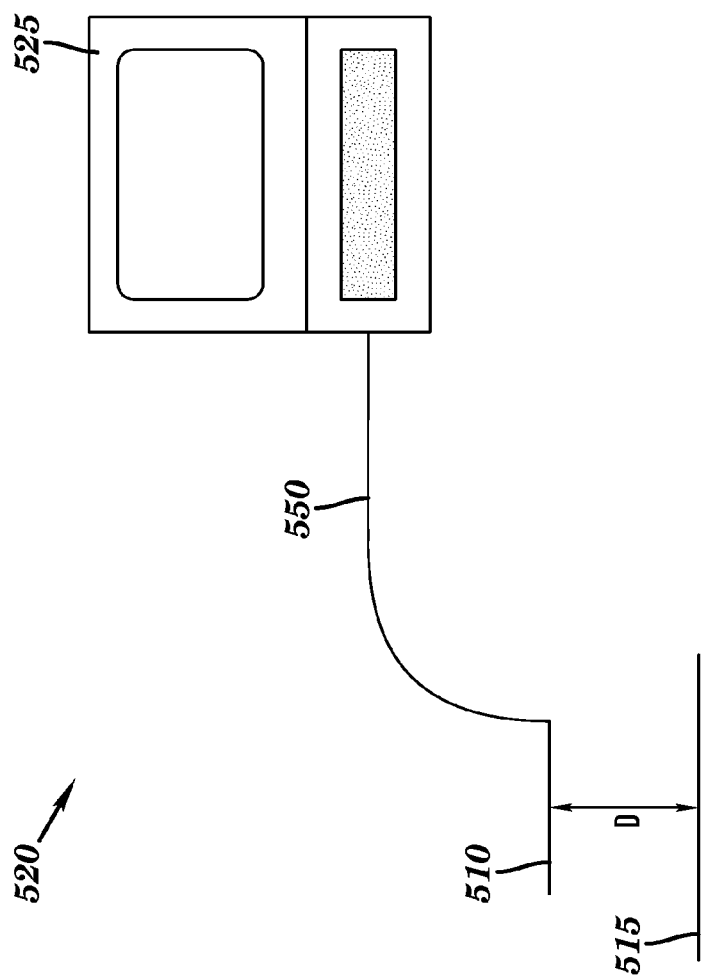

STRUCTURE AND METHOD FOR IN-LINE DEFECT NON-CONTACT TESTS

BACKGROUND

The present invention relates generally to defect detection in semiconductor device manufacturing, and, more particularly, to a test structure for determining open and short circuits in semiconductor devices.

For advanced integrated circuit process, the wiring line width can be tens of nanometers. As a result one issue during production is electrical opens in the wiring lines. Electrical opens occur due to defects such as hollow metal, stress voiding, missing patterns and other process errors. Additionally, electrical shorts occur due to defects such as metal debris or out-diffusion between wiring lines. It is critical to have methods and test structures on the wafer to test for these errors in the production process which allows the production team to detect when an error occurs prior to completing the manufacture of the entire wafer.

As part of the process monitoring and inline test for product chips, specially designed structures are often placed in Kerf areas, which are between functional dies and will be cut out during the dicing process. Such test structures should facilitate maximizing the efficiency of detection for shorts and opens by allowing for as many tests as necessary, using a minimal amount of area, while still detecting all defects of concern with minimal "escapes" (i.e. missed defects).

Certain test structures for wiring line in existence, such as comb structures for example, are configured to detect short circuits. Other test structures may be a serpentine structure, hybrid serpentine structures made up of serpentine structures and comb structures to detect both short and open circuits, and finally spiral structures such as that found in U.S. Pat. No. 7,187,179, entitled, "Wiring Test Structure for Determining Open and Short Circuits in Semiconductor Devices".

The current structures for open and short defect monitoring are designed for contact DC probing, where metal probes are brought in electrical contact with probe pads in order to detect open and short circuits. DC probing may subject the wafer to mechanical damage in low-k dielectrics and metal layer causing yield and reliability issues in advanced technologies. In addition metal probe pads (typically 60 um×80 um each) take significant space in the kerf area.

SUMMARY

According to one embodiment of the present invention, a method comprises the steps of forming a spiral test structure on a wafer, the spiral test structure has a capacitor. A frequency signal is provided to the spiral test structure by a test apparatus, for example a sensing spiral. The test structure is monitored for a reflected resonant frequency from the spiral test structure. By monitoring the output it is possible to determine if an open or a short is present in the spiral test structure. This is possible as the test structure will resonate in view of the spiral contacted at either end by a capacitor. When the spiral test structure does not have opens or shorts, it will resonate at a first frequency, when an open or a short is present the resonate frequency will change. The frequency applied by the sensing spiral may be a range of frequencies for example the range comprising 1 GHz to 5 GHz, or the frequency range may be larger for example from 100 KHz to 10 GHz.

The method may further comprise the step when an open or a short is detected determining if the errors are acceptable, in the case errors are acceptable testing additional spiral test structures. If the errors are not acceptable determining if the wafer can be reworked.

A system may be utilized to implement the method, where the system may comprise a wafer having a plurality of spiral test structures located on the kerf of the wafer. The spiral structures may be located on a first metal layer or on multiple metal layers. The system may further incorporate a test apparatus having a frequency transmitter and a receiver. The test apparatus may be a sensing spiral which may be placed over the spiral test structures. A controller may provide a range of frequencies to the test apparatus and receiving the resonant frequencies from the test apparatus. The resonant frequencies will be seen as reductions in signal response at the test apparatus. The range of frequencies may be for example from one to five GHz.

The spiral test structure may comprise a spiral winding on a metal layer of a wafer with a capacitor connected to either end of said spiral winding. This will allow for the spiral test structure to resonate when a frequency signal is presented to apparatus. The resonant frequency of the spiral test structure may changes when a short or an open is present. The spiral test structure may be located on the kerf of the wafer. Further the capacitor may be for example a front end of line capacitor or a back end of line capacitor.

A second embodiment may comprise the steps of forming a spiral test structure on a wafer, the spiral test structure having a capacitor. A frequency signal may be provided to the spiral test structure from a test apparatus. When a signal is provided to the spiral test structure the output is monitored to identify a reflected resonant frequency from the spiral test structure. Finally based on the detected resonant frequency it is possible to determine if a short or an open is present in the spiral test structure.

The test apparatus may comprise a sensing spiral, wherein the sensing spiral is placed over the spiral test structure. Further the frequency signal may be a range of frequencies for example from 1 GHz to 5 GHz or an even greater range for example from 100 KHz to 10 GHz. When a short or an open is detected it is possible to determine if the errors are acceptable, in the case errors are acceptable testing additional spiral test structures. In the event the errors are not acceptable determining if the wafer can be reworked.

In a further embodiment, it is possible to test for both shorts and opens and test for these errors on multiple layers. For example by incorporating test structures with smaller wire widths and larger spacing it is possible to test for opens, while simultaneously, by placing structures with larger wire widths and smaller spacing it is possible to test for shorts. In addition by designing the spiral test structures to have different resonant frequencies it is possible to test multiple test structures simultaneously.

BRIEF DESCRIPTION OF THE SEVERAL VIEWS OF THE DRAWINGS

FIG. 5 illustrates a system incorporating a sensing spiral and a test structure, with a controller connected to the sensing spiral.

DETAILED DESCRIPTION

Figure 1:
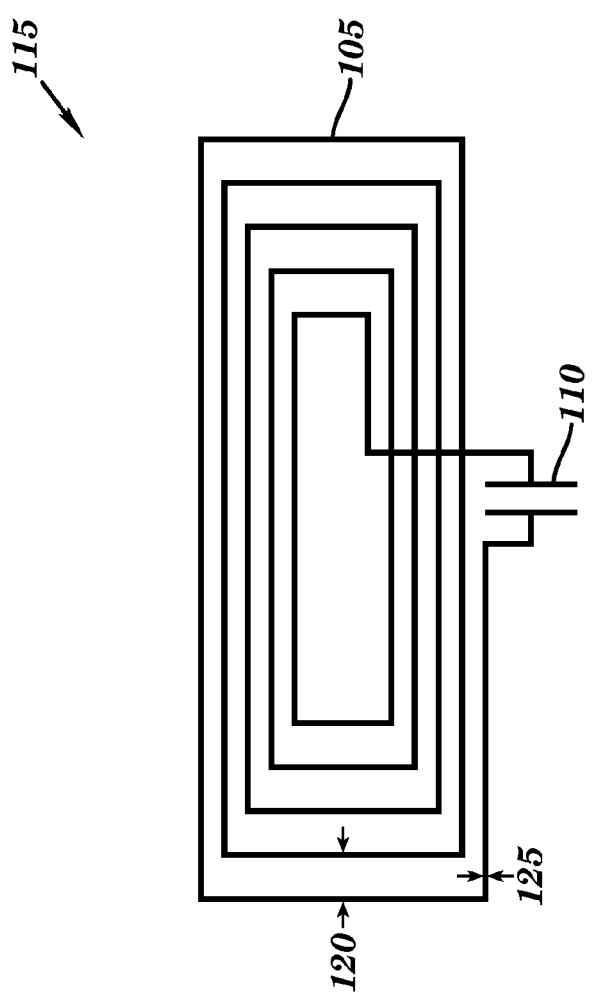
FIG. 1 illustrates a test spiral structure which is built into the kerf of the wafer.

With reference now to FIG. 1 illustrates a test spiral structure 115 which is built into the kerf of the wafer. While one embodiment suggests placing the test structure 115 in the kerf of the device, it is not necessary and may be desirable to place the test structure within the device being produced. The test spiral 105 may have multiple turns, for example five turns. Both ends of spiral 105 are connected to capacitor 110. The dimensions of the test spiral 105 may be determined by the width allowed by the kerf (not shown) (around 60~90 um), the other dimension is preferred to be large so that the interaction with a sensing spiral will be strong; it can be several hundreds of microns to millimeters and beyond. In one embodiment the outer dimensions of the spiral may be 500 um by 60 um. Further to allow for testing of multiple spiral test structures, it may be possible to vary the dimensions of the spiral test structures such that the resonant frequency of the spiral test structures will vary, thus allowing for the testing of multiple structures simultaneously as further illustrated in FIG. 7. The number of turns of the test spiral may vary, noting that the more turns results in a longer line with a higher probability of finding open defects, and have larger equivalent inductance and resistance. The larger equivalent inductance may benefit the interaction with the sensing spiral, but resulting higher resistance will reduce the interaction. So that this number needs to be optimized by simulations between defect probability and strong interaction. The dimensions of the wire and spacing may be determined by the wafer characteristics and the test type (i.e., open circuit or short circuit). For one embodiment to test open circuit, the wire may be of small or minimum width 125 (e.g., 50 nm's wide demonstrated in this invention by simulation shown in FIGS. 6A and 6B), and with large spacing 120 (e.g. 2 um demonstrated in this invention by simulation shown in FIGS. 6A and 6B) between the wires to avoid short circuit. For another embodiment to test short circuit, the wire may be of large width 125 (e.g., 2 um wide demonstrated in this invention by simulation shown in FIG. 6C) in order to avoid open circuit, and with small or minimum spacing 120 (e.g. 50 nm demonstrated in this invention by simulation shown in FIG. 6C) between the wires.

The test spiral 105 may be built on any one of the metal wire levels of the wafer. By building the test spiral 105 on multiple layers it is possible to determine if defects are present on multiple metal layers. Further by mixing of the test spiral 105 on the layers to test for opens and shorts it possible to determine whether either error may exist on any of the metal layers.

The capacitor 110 may be any one of the capacitors known to one of ordinary skill in the art. For example the capacitor may be front end of line (FEOL) capacitors such as polysilicon capacitors, deep trench capacitor or metal-insulator-silicon capacitors. In another embodiment the capacitors may be back end line (BEOL) capacitors, such as a vertical natural capacitor or metal-insulator-metal capacitor. It is possible to tune the test structure 115 by adjusting the capacitor 110 capacitance combined with the number of windings, size and shape of the test spiral 105. In this manner multiple test structures 115 may be tuned with different resonant frequencies thus allowing for the differentiation of multiple test structures 115.

Figure 2:
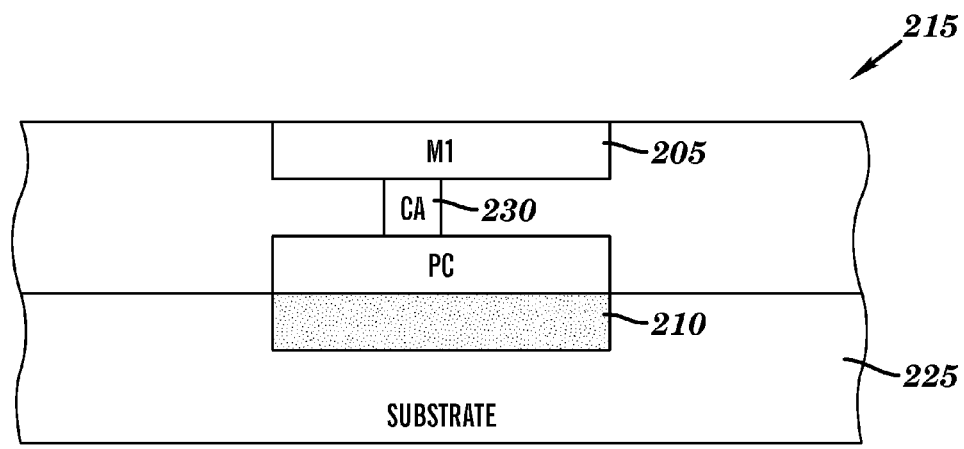
FIG. 2 illustrates a one embodiment of the invention incorporating a FEOL capacitor.

FIG. 2 illustrates a one embodiment of the invention incorporating a FEOL capacitor 210. The embodiment of the test structure 215 is located on substrate 225. Capacitor 210 may be a polysilicon capacitor which may be connected to the test spiral 205 located on metal wire layer M1 through via 230. The test spiral 205 may be located on M1 or any metal layer above M1. By locating test spirals on multiple metal layers it may be possible to test for opens and shorts on each layer where a test spiral is located.

Figure 3:
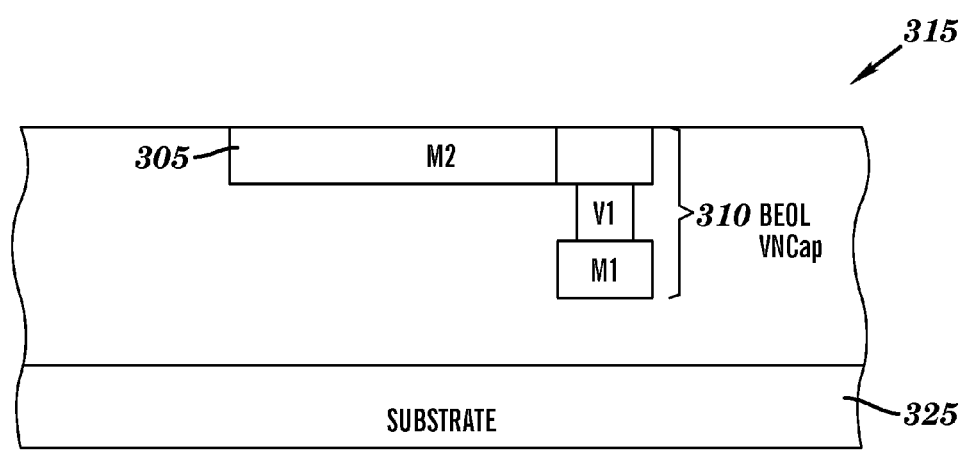
FIG. 3 illustrates a second embodiment of the invention incorporating a BEOL capacitor.

FIG. 3 illustrates a second embodiment of the invention incorporating a BEOL vertical natural capacitor 310. The embodiment of the test structure 315 is located on substrate 325. A test spiral 305 may be located in the final metal layer or any layer above layer M1 of the wafer. The test spiral 305 may be connected to a vertical natural capacitor 310. By utilizing a vertical natural capacitor 310, the test spiral 305 may be located on any of the layers on the wafer other than M1.

Figure 4:
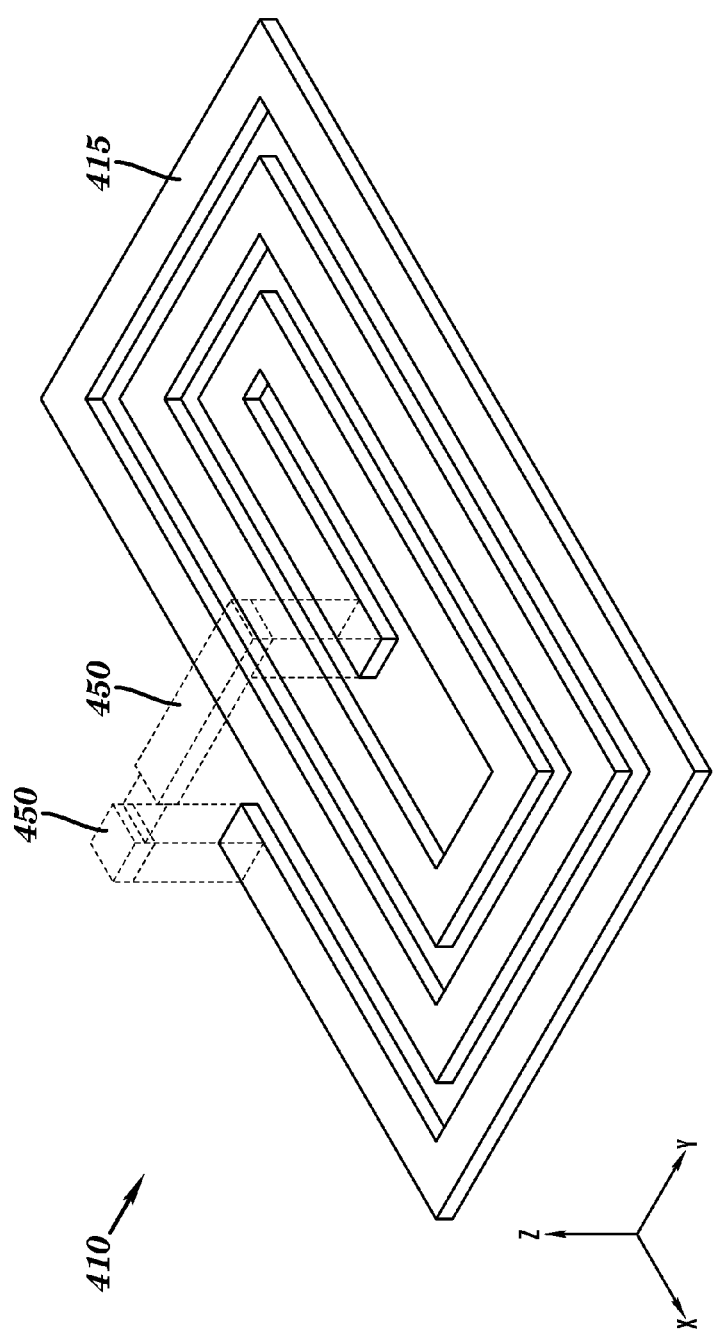
FIG. 4 illustrates a sensing spiral.

FIG. 4 illustrates a sensing spiral 410. The sensing spiral 410 is used to induce a resonant frequency in the test structure for example test structure 115 of FIG. 1. Wire structure 415 forms a spiral for applying a frequency to the test structure 115. Wire structure 415 may have a minimum width and spacing for package or PCB (Printed Circuit Board) level processing so that the overall spiral size can be comparable to the test structure such as test structure 115. The outer dimensions of the sensing spiral 410 should be larger than the dimensions of the test structure. For example, as shown in FIG. 1, test structure 115 may be 500 um by 60 um, therefore the sensing spiral needs to be at least 500 um or larger for enough interaction with test structure 115. The number of turns in the sensing spiral 410 may be determined by simulations to ensure good interaction with the test structure 115. Sensing spiral 410 may be connected to a system, such as system 520 of FIG. 5, through connections 450.

FIG. 5 illustrates a system 520 incorporating a sensing spiral, 510 such as sensing spiral 410 of FIG. 4 and a test structure 515 such as test structure 115 of FIG. 1, with a controller 525 connected to the sensing spiral 510 via connection 550. The sensing spiral 510 is placed over the test structure 515 and a frequency signal is passed through the sensing spiral 510 to induce a resonance in test structure 515. The sensing spiral 510 may sweep signals from for example 0.5 GHz to 5 GHz. The sensing spiral 510 may for example be placed 10 um to 100 um above test structure 515. The sensing spiral 510 senses the resonant frequency of the test structure 515. The sensed resonant frequency is provided to controller 525 to determine the results. Based on the resonant frequency of the test structure 515, it is possible to determine if there are defects are present in the test structure. Controller 525 may be a computer with signal generator and detector or other similar device such as a network analyzer or s-parameter tester. The device must be capable of providing a signal to and receive the frequency response from the sensing spiral via wires or other connecting means 550.

Figures 6A, 6B:
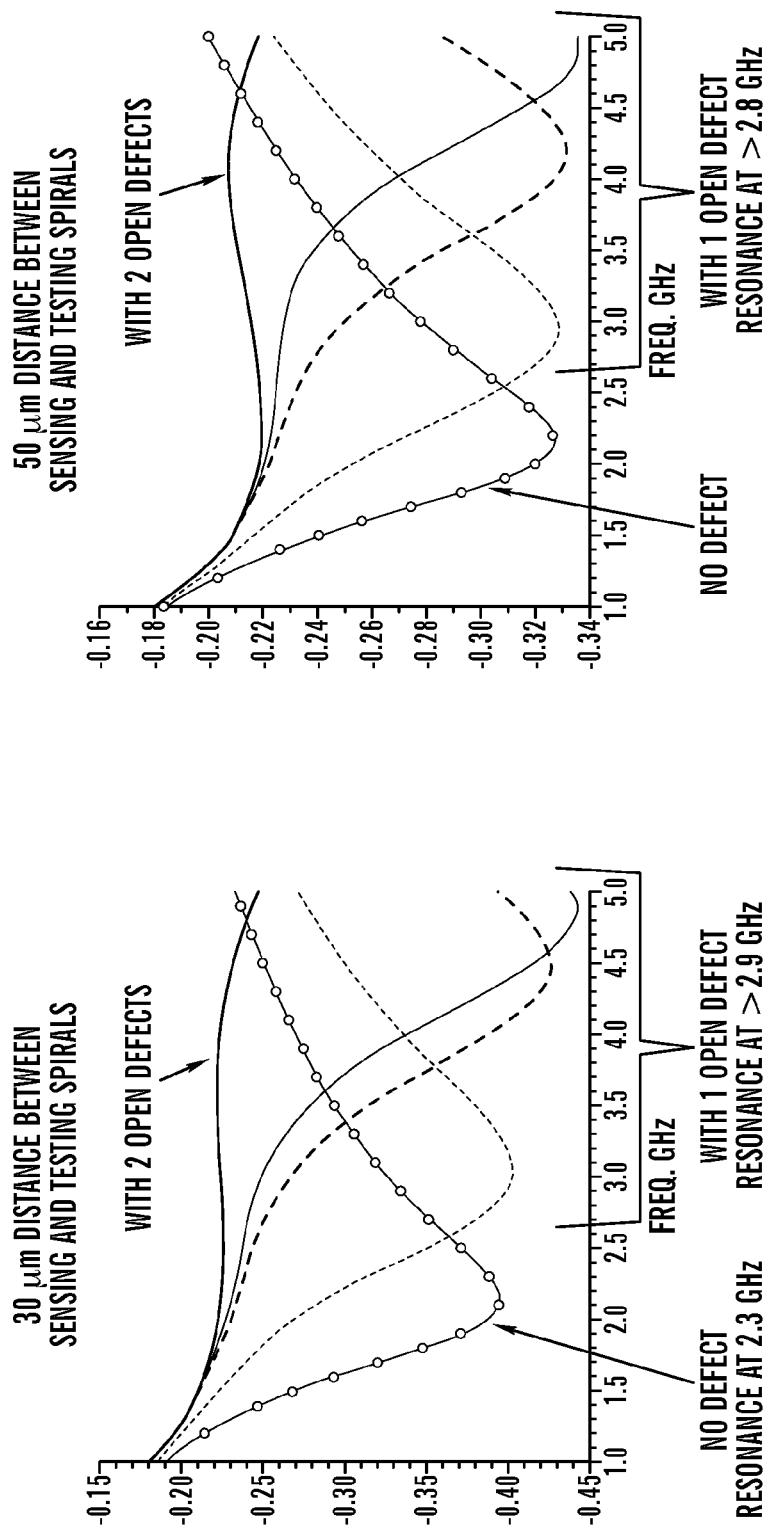
FIG. 6A illustrates a graph of a simulation of test results for opens for a sensing spiral placed 30 um above a test structure.
FIG. 6B illustrates a graph of a simulation of test results for opens for a sensing spiral placed 50 um above a test structure.

FIGS. 6A and 6B illustrate two graphs of simulations of test results for detecting open circuit for a sensing spiral placed 30 um above a test structure and a second graph for a sensing spiral placed 50 um above a test structure. FIG. 6A illustrates a simulation result of the sensing spiral 30 um above the test structure. As can be shown for the testing structure without opens, the response dips at ~2 GHz, however, when an open is present or multiple opens are present, the dip in response occurs at a much higher frequency. FIG. 6B, illustrates a simulation of placing the sensing spiral 50 um above the test structure. As can be seen similar results occur for an open versus when no defect is present. By knowing the response that should be present from testing, it is possible to determine if an open is present in the test structure and thereby the wafer may have errors present.

Figure 6C:
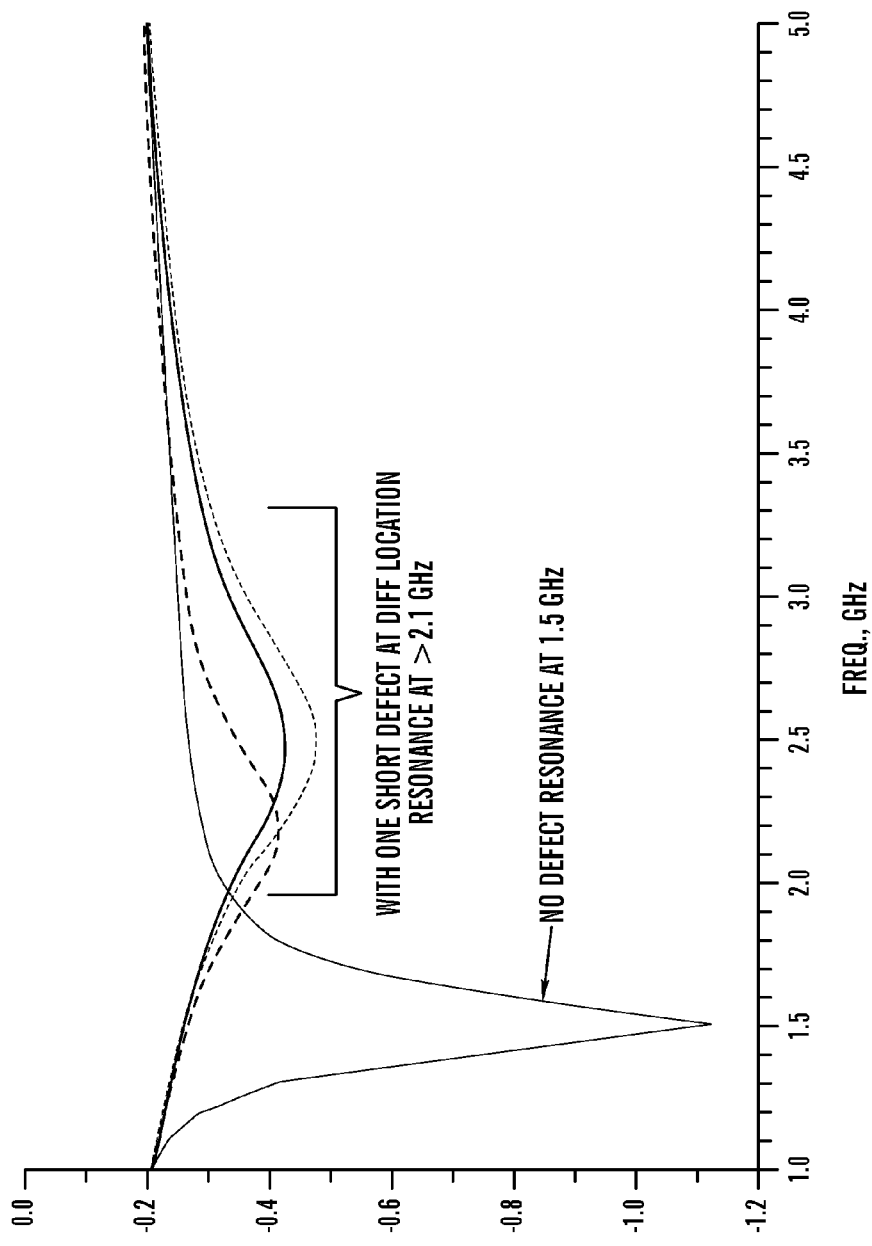
FIG. 6C illustrates a graph of a simulation of test results for a short for a sensing spiral placed 30 um above a test structure.

FIG. 6C illustrates a graph of a simulation of test results for detecting a short circuit for a sensing spiral placed 30 um above a test structure. The spiral test structure may be as described in FIG. 1 above. For example the wire may be 2 um wide in order to avoid open circuit, and with spacing of 50 nm between the wires. As can be see in FIG. 6C when no defect is present, a resonant frequency may be present at 1.5 GHz. However when a short is present in the spiral test structure, the resonant frequency moves to higher frequency with smaller magnitude. Through manipulation of the test structure 115 it is possible to change the resonant frequency of the test structure 115 making it easier to test multiple test structures simultaneously. Further if an error is present, by utilizing different resonant frequencies it will decrease the difficulty in determining which test structure 115 has an error present.

Figure 7:
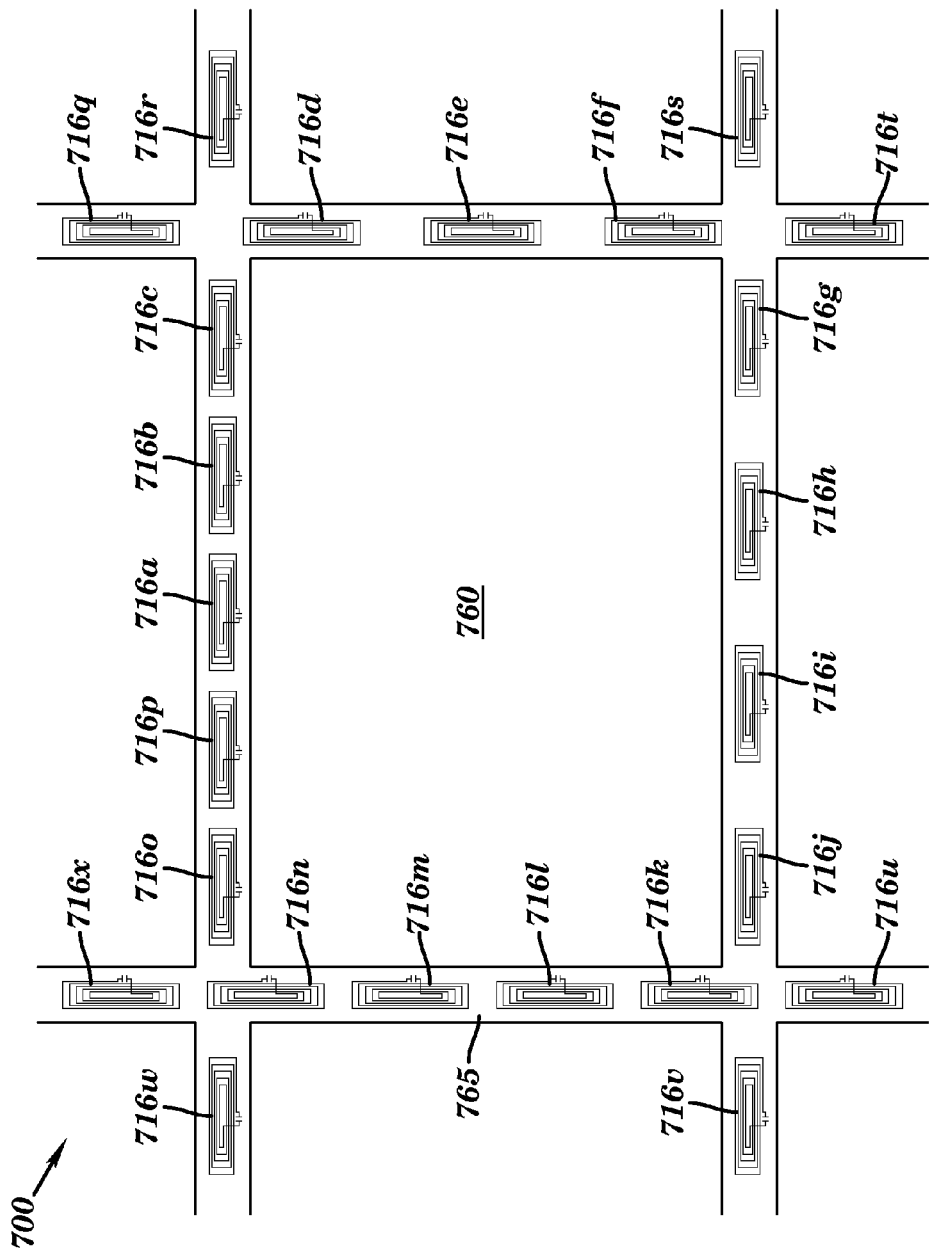
FIG. 7 illustrates an embodiment in which multiple test structures may be embedded in the kerf around a device.

FIG. 7 illustrates an embodiment in which multiple structures may be embedded in the kerf around a device. Semiconductor wafer 700 may contain multiple semiconductor devices 760 each of which is surrounded by a kerf 765. Spiral test structures 716a-716x are placed in the kerf 765. The spiral test structures 716a-716x may be placed as shown throughout the kerf 765. In addition the spiral test structures may be comprised of structures for testing both shorts and opens. The spacing should be sufficient such that the sensing spiral, for example sensing spiral 510 in FIG. 5, is able to distinguish the resonant signals from the spiral test structures 716. By properly placing the spiral test structures 716 it is possible that multiple test may take place simultaneously by using multiple sensing spiral with multiple signal generating/receiving units. In addition spiral test structures 716 may be located on multiple levels. For example spiral test structure 716a may be located on metal layer 1, spiral test structure 716b may be located on metal layer 2. By locating the spiral test structures 716 on multiple metal layers it is possible to test each of the layers for opens or shorts on several layers at once. In addition, it is possible to test after each metal layer is completed. In the event an error is found, the wafer may be tested further to determine the extent of the errors. Once the errors have been fully vetted the wafer may be scrapped, reworked or it may be determined that the device may still operate within acceptable parameters.

Figure 8:
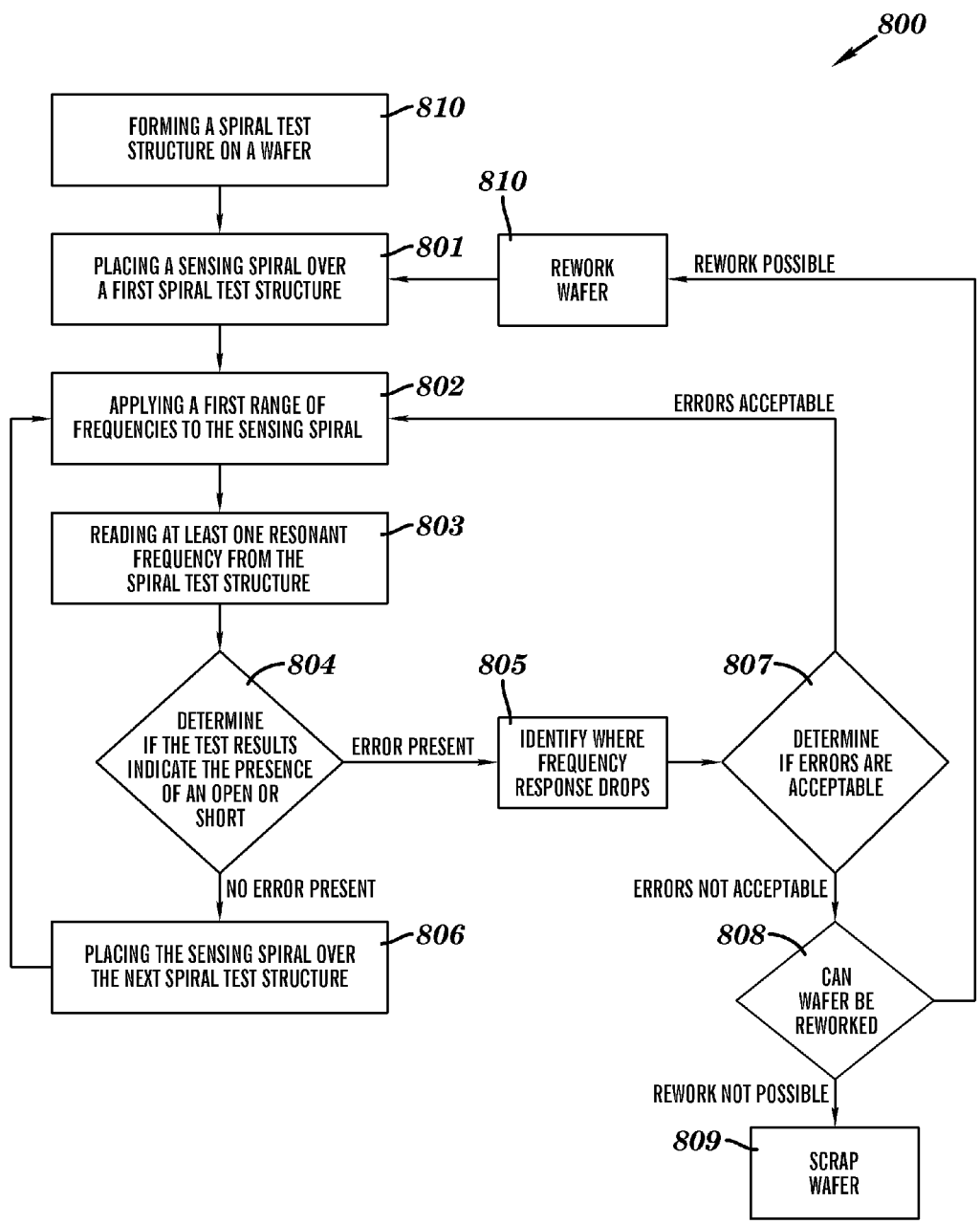
FIG. 8 is a method for testing a wafer utilizing an embedded test spiral.

FIG. 8 is a method for testing a wafer utilizing an embedded test spiral. The steps may comprise forming a spiral test structure on a wafer, the spiral test structure having a capacitor. The method may further comprise the step of providing a frequency signal to the spiral test structure from a test apparatus. Further the method may comprise the step of monitoring a reflected resonant frequency from the spiral test structure. Finally the method may comprise the step of determining if an open is present in the spiral test structure.

The test apparatus may comprise a sensing spiral, wherein the sensing spiral is placed over the spiral test structure. The sensing spiral may be a spiral such as the one taught in FIG. 4. With a sensing spiral such as the one shown in FIG. 4 a range of frequencies is applied to the spiral test structure. By applying a range of frequencies it is possible to see multiple responses to various frequencies. For example the range of frequencies applied may be from 1 GHz to 5 GHz. As shown in FIG. 6 if the sensing spiral is placed 30 um above the spiral test structures then when an open is present, the resonant frequency will shift higher or not appear at all if more than one open is present. For example when no defect is present the resonant frequency may be ~2.2 GHz. However when an open is present the resonant frequency may shift to greater than 2.9 GHz. By placing the sensing spiral 50 um above the spiral test structure the resonant frequency when no open is present may be ~2.2 GHz, while when an open is present the resonant frequency may shift to greater than 3 Ghz. While FIG. 6. illustrates operation from 1 GHz to 5 GHz, this range is not exclusive.

Once errors have been detected, the method may further comprise the step to determine if the errors are acceptable, in the case in which errors are acceptable the testing can move to additional spiral test structures. If the errors are not acceptable it may be advantageous to determine if the wafer can be reworked to correct the errors.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. A method comprising:
    forming a first spiral test structure in a wiring layer of a semiconductor wafer, the first spiral test structure comprising a first capacitor connected to two ends of a first test spiral, the first capacitor comprises a first conductive plate and a second conductive plate separated by an insulator, the first conductive plate is electrically connected to one end of the first test spiral and the second conductive plate is electrically connected to the other end of the first test spiral such that the first spiral test structure comprises a first predetermined resonant frequency dependent on physical dimensions of the first test spiral and a capacitance of the first capacitor;
    forming a second spiral test structure in the wiring layer of the semiconductor wafer, the second spiral test structure comprising a second capacitor connected to two ends of a second test spiral, the second capacitor comprises a first conductive plate and a second conductive plate separated by an insulator, the first conductive plate is electrically connected to one end of the second test spiral and the second conductive plate is electrically connected to the other end of the second test spiral such that the second spiral test structure comprises a second predetermined resonant frequency dependent on physical dimensions of the second test spiral and a capacitance of the second capacitor, a wire width of the first test spiral is smaller than a wire width of the second test spiral, and a wire spacing of the first test spiral is greater than a wire spacing of the second test spiral;

providing a first range of frequencies to the first spiral test structure from a test apparatus causing the first spiral test structure to resonate at a first reflected resonant frequency;

monitoring the first reflected resonant frequency of the first spiral test structure;

determining if an open circuit exist in the first spiral test structure based on a change in the first resonant frequency as compared to the first predetermined resonant frequency;

providing a second range of frequencies to the second spiral test structure from the test apparatus causing the second spiral test structure to resonate at a second reflected resonant frequency;

monitoring the second reflected resonant frequency of the second spiral test structure; and determining if a short exist in the second spiral test structure based on a change in the second resonant frequency as compared to the second predetermined resonant frequency.

2. The method of claim 1, wherein providing the first range of frequencies to the first spiral test structure and providing the second range of frequencies to the second spiral test structure comprises:

placing a sensing spiral of the test apparatus directly above the first test spiral without contacting the first test spiral;

placing the sensing spiral of the test apparatus directly above the second test spiral without contacting the second test spiral.

3. The method of claim 1, wherein a width of the metal wire of the first test spiral is approximately 50 nm and a wire spacing of the test spiral is approximately 2 μm, and a width of the metal wire of the second test spiral is approximately 2 μm and a wire spacing of the test spiral is approximately 50 nm.

4. The method of claim 1, wherein the first range of frequencies and the second range of frequencies comprises frequencies ranging from 1 GHz to 5 GHz.

5. The method of claim 1, wherein the first range of frequencies and the second range of frequencies comprises frequencies ranging from 100 KHz to 10 GHz.

6. The method of claim 1, wherein both the first spiral test structure and the second spiral test structure are located in a first metal wiring layer of the semiconductor wafer.

7. A system comprising:

a semiconductor wafer comprising a plurality of spiral test structures, the plurality of spiral test structures each comprising a single capacitor and a test spiral, the capacitor comprises a first conductive plate and a second conductive plate separated by an insulator, the first conductive plate is electrically connected to one end of the test spiral and the second conductive plate is electrically connected to the other end of the test spiral such that each of the plurality of spiral test structures comprises a predetermined resonant frequency based on physical dimensions of its test spiral and a capacitance of its capacitor, wherein each metal wiring layer of the semiconductor wafer comprises a first test spiral and a second test spiral each having different wire thickness and different wire spacing from each other;

a test apparatus, comprising a frequency transmitter and a receiver; and a controller for providing a range of frequencies to the test apparatus and receiving resonant frequencies from the test apparatus.

8. The system of claim 7, wherein a wire width of the first test spiral is smaller than a wire width of the second test spiral.

9. The system of claim 7, wherein the plurality of spiral test structures are located entirely in a kerf of the semiconductor wafer.

10. The system of claim 7, wherein a wire width of the first test spiral is smaller than a wire width of the second test spiral, and a wire spacing of the first test spiral is greater than a wire spacing of the second test spiral.

11. The system of claim 7, wherein the test apparatus comprises a sensing spiral.

12. The system of claim 7, wherein the range of frequencies are between one and five GHz.

13. The system of claim 7, wherein the plurality of spiral test structures are located entirely in a kerf of the semiconductor substrate and positioned around each of a plurality of devices.

14. The system of claim 7, wherein the capacitor is a deep trench capacitor.

15. The system of claim 7, wherein each of the plurality of test structures is designed with a different predetermined resonant frequency.

16. The system of claim 7, wherein dimensions of the test spiral of a first test structure vary from dimension of the test spiral of a second test structure such that the predetermined resonant frequency of the first test structure is different from the predetermined resonant frequency of the second test structure.

17. An apparatus comprising:

a first spiral winding on a metal wiring layer of a semiconductor wafer;

a first capacitor connected to both ends of the first spiral winding, the first capacitor comprises a first conductive plate and a second conductive plate separated by an insulator, the first conductive plate is electrically connected to one end of the first spiral winding and the second conductive plate is electrically connected to the other end of the first spiral winding such that the first spiral winding and the first capacitor comprises a first predetermined resonant frequency based on physical dimensions of the first spiral winding and a capacitance of the first capacitor;

a second spiral winding on the metal wiring layer of a semiconductor wafer; and a second capacitor connected to both ends of the second spiral winding, the second capacitor comprises a first conductive plate and a second conductive plate separated by an insulator, the first conductive plate is electrically connected to one end of the second spiral winding and the second conductive plate is electrically connected to the other end of the second spiral winding such that the second spiral winding and the second capacitor comprises a second predetermined resonant frequency based on physical dimensions of the first spiral winding and a capacitance of the first capacitor, a wire width of the first test spiral is smaller than a wire width of the second test spiral, and a wire spacing of the first test spiral is greater than a wire spacing of the second test spiral, wherein the resonant frequency of the first spiral winding is different from the first predetermined resonant frequency based on whether an open circuit is present, wherein the resonant frequency of the second spiral winding is different from the second predetermined resonant frequency based on whether a short circuit is present.

18. The apparatus of claim 17, wherein the spiral winding is located entirely in a kerf of the semiconductor wafer.

19. The apparatus of claim 17, wherein the capacitor is a deep trench capacitor.

20. The apparatus of claim 17, wherein the capacitor is a back end of line capacitor.

21. The apparatus of claim 17, wherein the spiral winding has a wire dimension of less than 75 nm wide.

22. The apparatus of claim 17, wherein the spiral winding has a wire dimension greater than 100 nm wide.

23. A method comprising:

forming a first test spiral test structure entirely in a kerf region of a semiconductor wafer, the first spiral test structure comprising a first deep trench capacitor connected to a first test spiral, the first test spiral is a metal wire in a spiral configuration located in a single metal wiring level above a semiconductor substrate of the semiconductor wafer, the first deep trench capacitor is located in the semiconductor substrate and electrically connected to two ends of the first test spiral, the first deep trench capacitor comprises a first conductive plate and a second conductive plate separated by a first insulator, the first conductive plate is electrically connected without interruption to one end of the first test spiral and the second conductive plate is electrically connected without interruption to the other end of the first test spiral such that the first spiral test structure comprises a first predetermined resonant frequency dependent on physical dimensions of the first test spiral and a capacitance of the first deep trench capacitor;

forming a second spiral test structure entirely in the kerf region, the second spiral test structure comprising a second deep trench capacitor connected to a second test spiral, the second test spiral is a metal wire in a spiral configuration located in the single metal wiring level, the second deep trench capacitor is located in the semiconductor substrate and electrically connected to two ends of the second test spiral, the second deep trench capacitor comprises a third conductive plate and a fourth conductive plate separated by a second insulator, the third conductive plate is electrically connected without interruption to one end of the second test spiral and the fourth conductive plate is electrically connected without interruption to the other end of the second test spiral such that the second spiral test structure comprises a second predetermined resonant frequency dependent on the physical dimensions of the second test spiral and a capacitance of the second deep trench capacitor, a wire width of the first test spiral is smaller than a wire width of the second test spiral and a wire spacing of the first test spiral is greater than a wire spacing of the second test spiral.

24. The method of claim 23, wherein causing the spiral test structure to resonate comprises:

placing a sensing spiral of the test apparatus directly above the first test spiral without contacting the first test spiral;

placing the sensing spiral of the test apparatus directly above the second test spiral without contacting the second test spiral.

25. The method of claim 23, wherein a width of the metal wire is approximately 2 μm and a wire spacing between any two adjacent portions of the metal wire is approximately 50 nm.

26. The method of claim 23, wherein the range of frequencies comprises frequencies ranging from 1 GHz to 5 GHz.

27. The method of claim 23, wherein the range of frequencies comprises frequencies ranging from 100 KHz to 10 GHz.

28. The method of claim 23, further comprising:

forming an additional spiral test structures on another metal wiring layer above the single wiring layer.

* * * * *